(12) United States Patent
Quellmalz et al.

(10) Patent No.: US 11,504,959 B2
(45) Date of Patent: Nov. 22, 2022

(54) METHOD OF MATERIAL TRANSFER

(71) Applicants: Arne Quellmalz, Stockholm (SE); Kristinn Gylfason, Solna (SE); Niclas Roxhed, Bromma (SE); Göran Stemme, Lidingö (SE); Frank Niklaus, Täby (SE)

(72) Inventors: Arne Quellmalz, Stockholm (SE); Xiaojing Wang, Stockholm (SE); Kristinn Gylfason, Solna (SE); Niclas Roxhed, Bromma (SE); Göran Stemme, Lidingö (SE); Frank Niklaus, Täby (SE)

(73) Assignees: Arne Quellmalz, Stockholm (SE); Frank Niklaus, Täby (SE); Kristinn Gylfason, Solna (SE); Niclas Roxhed, Bromma (SE); Göran Stemme, Lidingö (SE)

( * ) Notice: Subject to any disclaimer, the term of this patent is extended or adjusted under 35 U.S.C. 154(b) by 0 days.

(21) Appl. No.: 17/425,749

(22) PCT Filed: Jan. 24, 2020

(86) PCT No.: PCT/EP2020/051831
§ 371 (c)(1),
(2) Date: Jul. 26, 2021

(87) PCT Pub. No.: WO2020/152358
PCT Pub. Date: Jul. 30, 2020

(65) Prior Publication Data
US 2022/0161537 A1 May 26, 2022

(30) Foreign Application Priority Data

Jan. 25, 2019 (SE) .................................. 1930021-9
Jan. 25, 2019 (SE) .................................. 1930025-0
Sep. 11, 2019 (SE) .................................. 1930293-4

(51) Int. Cl.
*B32B 37/00* (2006.01)
*B82B 3/00* (2006.01)

(52) U.S. Cl.
CPC .......... *B32B 37/025* (2013.01); *B82B 3/0076* (2013.01)

(58) Field of Classification Search
CPC ......... B32B 37/24; B32B 37/26; B32B 38/10; B29C 65/48
See application file for complete search history.

(56) References Cited

U.S. PATENT DOCUMENTS 8,916,013 B2 * 12/2014 Hong .................... B32B 37/025
156/239
9,039,886 B2 * 5/2015 Gong .................... C01B 32/194
156/247

(Continued)

OTHER PUBLICATIONS

Fechine Guilhermino J M et al: "Direct dry transfer of chemical vapor deposition graphene to polymeric substrates", Carbon, Elsevier, Oxford, GB, vol. 83, Nov. 27, 2014, pp. 224-231.

(Continued)

*Primary Examiner* — Francisco W Tschen
*Assistant Examiner* — Abhishek A Patwardhan
(74) *Attorney, Agent, or Firm* — Harness, Dickey & Pierce, P.L.C.; Anthony Fussner

(57) ABSTRACT

A method for transferring an atomically thin layer comprising providing a target substrate and a donor substrate on which a first atomically thin layer has been formed. The method further comprises disposing an adhesion layer at the donor substrate or at the target substrate. The method further comprises bringing the target substrate and the donor substrate together. Further, the method comprises bonding (Continued)

together the donor substrate, the adhesion layer and the target substrate and removing the donor substrate.

14 Claims, 5 Drawing Sheets

(56) References Cited

U.S. PATENT DOCUMENTS

| | | | | |
|---|---|---|---|---|
| 2011/0048625 | A1* | 3/2011 | Caldwell | C01B 32/194 |
| | | | | 156/233 |
| 2014/0087191 | A1* | 3/2014 | Chua | B32B 37/025 |
| | | | | 428/408 |
| 2017/0338312 | A1* | 11/2017 | Treossi | B32B 9/007 |
| 2018/0257359 | A1* | 9/2018 | Johnson | C03C 17/22 |
| 2020/0308005 | A1* | 10/2020 | Arliguie | B05D 3/12 |

OTHER PUBLICATIONS

Yi Chen et al: "Progress and Challenges in Transfer of Large-Area Graphene Films", Advanced Science, vol. 3, No. 8, Feb. 2016, pp. 1-15.
PCT International Search Report and Written Opinion for PCT/EP2020/051831 that is the parent application to the instant application; dated May 4, 2020, 14 pages.

* cited by examiner

METHOD OF MATERIAL TRANSFER

This patent application is a U.S. national stage filing under 35 U.S.C. § 371 of PCT International Application No. PCT/EP2020/051831 filed Jan. 24, 2020 (published as WO2020/152358 on Jul. 30, 2020), which claims priority to and the benefit of Swedish Application No. 1930021-9 filed Jan. 25, 2019, Swedish Application No. 1930025-0 filed Jan. 25, 2019, and Swedish Application No. 1930293-4 filed Sep. 11, 2019. The entire contents of these applications are incorporated herein by reference.

TECHNICAL FIELD

The present application relates generally to the field of semiconductor process technology. In particular, the present application relates to a method for transferring an atomically thin layer, such as a graphene or another two-dimensional (2D) material layer.

BACKGROUND 2D materials such as graphene, MoS2 and their heterostructures are extremely promising materials for emerging electronics, nanoelectromechanical systems (NEMS) and sensors, but the transfer from their growth substrates to silicon substrates remains manual and laborious.

For example, most transfer methods of graphene from its growth substrate require the addition of a temporary supporting layer in contact with graphene which inevitably results in residuals on its surface and hence an unwanted change in electrical properties. Wet transfer methods have been carried out on wafer-scale. However, they require unconventional steps, such as manual lifting (or fishing) of a floating graphene sheet from the surface of a liquid bath which can cause process variations and low yield. Hence, such methods are not scalable to high volume production. Dry transfer of small graphene samples by manual bonding to various polymers and subsequent delamination has been used to realize non-suspended graphene devices.

The astonishing properties of two-dimensional (2D) materials have aroused tremendous interest in the semiconductor industry. These new types of atomically thin materials promise to continue the trend of continuously shrinking transistors and increasingly higher performance of sensors. For graphene, an atomically thin layer of carbon atoms, the ultra-high charge carrier mobility and its strong light absorption enable the implementation of high-speed transistors, flexible electronics, Hall sensors, high-speed photodetectors for telecommunication and imaging technologies. Transition metal dichalcogenides are often semiconducting and promise advancements for high-and low power transistors, memtransistors and optoelectronics such as single-photon emitters for optical quantum communication. Vertical stacking of 2D materials forms van der Waals heterostructures, an emerging class of metamaterials, with new material properties given by synergetic effects between layers. As an example, a heterostructure of two graphene layers with a small twist angle between their lattices exhibit properties of both a correlated insulator and unconventional superconductor.

Integrating 2D materials into conventional semiconductor fabrication lines is critically important to exploit these outstanding electrical and optical properties in commercial devices while benefitting from established silicon-based infrastructure with low-cost high-volume manufacturing on large substrates. The synthesis of 2D materials by chemical vapor deposition (CVD) is scalable to large areas and the best contemporary processes provide close to intrinsic material quality. However, the high process temperature required for good material quality rules out direct growth on pre-processed silicon electronics substrates, and hence compel a material transfer from dedicated growth substrates to the device substrate. The commonly used wet transfer relies on an intermediate polymeric carrier, typically PMMA or PC, which mechanically supports the 2D material during the removal of the growth substrate and the transfer of the 2D layer to the target substrate. For graphene, this process degrades the material properties by causing defects, wrinkles and strain in the transferred layer. Additionally, residuals of the polymeric carrier layer remain on the surface of the 2D material and degrade the electrical transport properties. Attempts to minimize these adverse effects of wet transfers include bubble-delamination, advanced cleaning procedures and replacing PMMA with paraffin as carrier polymer. Nevertheless, they do not eliminate the noted issues entirely. Dry transfer using rollers, laminators and hot presses enables the reuse of metallic growth substrates and avoids submersion of the target substrate in liquids which is beneficial for the integration with suspended devices. However, dry-transferred layers suffer from microcracks, wrinkles, reduction in charge carrier mobility or contamination by residuals from sacrificial carrier layers. Delamination of single-crystal CVD graphene from copper foil by strong van der Waals forces with a stamp of exfoliated hexagonal boron nitride (hBN) yields almost intrinsic graphene properties but is limited in size to areas in the range of hundreds of micrometers. Most importantly, neither of the proposed transfer methods is compatible with industry routines for large-scale manufacturing while still preserving the high quality of the 2D material as on the growth substrate.

There is thus a need for improved methods for transferring atomically thin material layers (2D materials) from one substrate to another, without degrading the atomically thin material layer, and with high repeatability.

SUMMARY

It is therefore an object of the present invention to overcome at least some of the above-mentioned drawbacks, and to provide an improved method for transferring an atomically thin layer with respect to quality and repeatability.

This and other objects are achieved by means of a method as defined in the appended independent claim. Other embodiments are defined by the dependent claims.

According to a first aspect of the present disclosure, a method for transferring an atomically thin layer is provided. The method comprises providing a target substrate and a donor substrate on which a first atomically thin layer (or 2D material layer) has been formed. The method further comprises disposing an adhesion layer at the donor substrate or at the target substrate. Further, the method comprises bringing the target substrate and the donor substrate together. The method further comprises bonding together the donor substrate, the adhesion layer and the target substrate and removing the donor substrate.

An atomically thin layer (or 2D material layer, or a 2D material layer stack) may be a layer of material which is one or a small number of atoms thick. For example, an atomically thin layer made from transition metal dichalcogenide (TMD) monolayers may comprise fewer than 100 TMD monolayers. Specifically, an atomically thin layer may comprise fewer than 30 TMD monolayers. More specifically, an atomically thin layer may comprise fewer than 10 TMD monolayers, such as a single monolayer.

It will be appreciated that, in the present method, the donor substrate and the target substrate are bonded with help of the adhesion layer.

The present method may provide a generic method to dry-transfer 2D materials, and to form their heterostructures, which may preserve the material properties as present on the growth substrate. The adhesive layer may have the ability to mold repeatedly into the topography of the growth substrate, which may allow stacking of layers to heterostructures without intermediate contamination by residuals of polymeric carrier layers. In this process, the surface topography of the growth substrate may be replicated on the target substrate which may prevent wrinkles and additional strain in the transferred 2D material.

The present method may allow to avoid manual handling of released layers and rely only on established tools and materials which may make it compatible with large-scale manufacturing in industrial facilities. The present transfer method may be applicable to 2D materials in general; independent of their size and type of growth substrate.

The present method of wafer-scale transfer of transferring atomically thin layers by adhesive wafer bonding may allow the use of conventional semiconductor processing equipment and may require no manual handling of the 2D-material/atomically thin layer after release. This combination may make the method suitable for large-scale and high-volume device manufacturing and may provide high repeatability, which are key requirements for commercial production environments.

The method according to the first aspect of the disclosure may, for example, be used for the transfer of large-area chemical vapor deposited (CVD) graphene from its growth substrate (such as a copper foil) to a target wafer by adhesive wafer bonding using bisbenzocyclobutene (BCB) as an intermediate adhesive layer. The method may allow the use of conventional wafer bonding equipment, which enables the scalable transfer of graphene and the realization of (and high-volume fabrication of) both supported and suspended graphene devices on wafer-scale. The present (automated) method may circumvent manual handling of graphene after release from its growth substrate and avoid polymeric carrier layers, which are a well-known source of contamination. Hence, the proposed process may provide the transfer of graphene with high quality and repeatability, yield and scalability. The method may further avoid contamination by supporting layers. Furthermore, this transfer method may be applicable to other two-dimensional materials, which are seen as the future of electronics beyond silicon.

According to some embodiments, the adhesion layer may, during bringing the target substrate and the donor substrate together, be incompressible or at least substantially incompressible. During bringing the target substrate and the donor substrate together, the adhesion layer may have a viscosity below 10000 cPs.

For example, the adhesion layer may have a viscosity below 1000 cPs during bringing the target substrate and the donor substrate together. Specifically, the adhesion layer may have a viscosity below 100 cPs during bringing the target substrate and the donor substrate together.

It will be appreciated that the adhesive layer may be (at least substantially or nearly) incompressible and have a viscosity below 10000 cPs when the target substrate and the donor substrate are being brought together, and that the adhesive layer may have other properties at other times during the method. For example, after bonding, the adhesive layer may no longer be (substantially) incompressible with a viscosity below 10000 cPs.

The adhesion (adhesive) layer being at least substantially (or nearly) incompressible, and having a viscosity below 10000 cPs, may provide the ability of the adhesive layer to mold repeatedly into the topography of both the growth substrate and the target substrate. Such ultra-conformal flow or plastic deformation behavior of the adhesive during bonding may ensure moderate pressure peaks on the 2D material and thus that minimal stress, and no substantial stress concentrations, are exerted on the 2D material. Surprisingly, even though a high force may be applied onto the substrates, a very thin and fragile 2D material may be transferred without damage using this method. Hence, a person skilled in the art will appreciate the high quality and the low amount of defects of the 2D material enabled by the method.

The method may further allow stacking of layers to heterostructures without intermediate contamination by residuals of polymeric carrier layers.

According to some embodiments, bonding together the donor substrate, the adhesion layer, and the target substrate may comprise applying heat.

According to some embodiments, bonding together the donor substrate, the adhesion layer, and the target substrate may comprise applying pressure.

Depending on the material being used for the adhesion layer, the applied temperature and/or pressure may vary. For example, if the adhesion layer comprises a polymer, a suitable temperature for bonding may be in the range 20-500° C. More specifically, bonding may take place at a temperature in the range 20-250° C.

For example, pressure in the range 0.1-200 bar may be applied at the bond interface. For instance, if the adhesion layer comprises a polymer, bonding may be performed in vacuum or at atmospheric pressure.

According to some embodiments, removing the donor substrate may comprise etching the donor substrate or detaching by intercalation of components at the interface between the donor substrate and the atomically thin layer.

According to some embodiments, the method may further comprise providing a second donor substrate on which a second atomically thin layer has been formed. The method may further comprise bringing the target substrate and the second donor substrate together such that at least a portion of the second atomically thin layer is in contact with the first atomically thin layer. The method may further comprise bonding the second atomically thin layer to the first atomically thin layer and removing the second donor substrate.

The first atomically thin layer and the second atomically thin layer may bond to form a heterostructure.

Methods according to such embodiments may for example allow the integration of graphene/hexagonal boron nitride (hBN) heterostructure devices on large-areas by adhesive wafer bonding, a method suitable for industrial mass-production.

For example, using a method in accordance with the present embodiment, graphene and hBN may be stacked by two consecutive bond transfers whereby the graphene and its interface to hBN is not in contact with potentially contaminating polymers or adhesives at any time. Graphene/heterostructure devices with electrical bottom contacts have also been realized to show the feasibility of back end of the line integration of 2D materials heterostructures on standard silicon substrates using only established processes and manufacturing tools.

The above example is based on a dry transfer method of graphene by adhesive wafer bonding. In the example, the method is extended: (a) to hBN, another exciting 2D material, (b) by stacking graphene and hBN into heterostructures, and (c) by integrating electrical bottom contacts to show the applicability for back end of the line integration of device structures on preprocessed substrates.

According to some embodiments, the method may further comprise forming an assembly comprising the adhesion layer and at least one structure. The assembly may be formed at the donor substrate and/or at the target substrate. The method may further comprise bringing together the target substrate and the donor substrate such that at least a portion of the first atomically thin layer is arranged against the at least one structure, and the adhesion layer is arranged against the target substrate. The method may further comprise bonding together the donor substrate, the assembly and the target substrate.

According to some embodiments, the at least one structure comprises at least one cavity in the adhesion layer. After removal of the donor substrate, a portion of the first atomically thin material may be suspended over the at least one cavity.

According to some embodiments, the at least one structure may comprise at least one metal structure.

Metal structures in or on the adhesion layer may for example form electrical contacts in a device formed using the disclosed method, or electrical contacts to an embedded electronic circuit in the substrate.

Electrical contacts to graphene are essential building blocks for any type of graphene device.

A high contact resistance at the metal-graphene interface might degrade the device performance.

Methods in accordance with this embodiment may provide integration of bottom-contacts by metallization prior bonding. Bottom contacts may facilitate fabrications and/or reduce the amount of process steps after transfer, which might have adverse effects on the transferred atomically thin material.

Such metal structures may for example comprise gold electrodes or titanium electrodes.

According to some embodiments, the at least one structure may comprise at least one dielectric structure.

Dielectric structures may be formed in or on the adhesion layer.

According to some embodiments, the at least one structure may comprise at least one protrusion of the target substrate through the adhesion layer.

According to some embodiments, the at least one structure may comprise a second atomically thin layer.

The first atomically thin layer and the second atomically thin layer may, after bonding, form a heterostructure.

According to some embodiments, the structure comprising the second atomically thin layer may further comprise a further layer covering at least a portion of the second atomically thin layer. The further layer may be in contact with the adhesion layer.

For example, the further layer may be a passivation layer deposited on the second atomically thin layer. In such embodiments, the second atomically thin layer may not be in direct contact with the adhesion layer. For example, the further layer (such as a passivation layer) may be in contact with the adhesion layer and form a barrier between the adhesion layer and the second atomically thin layer.

According to some embodiments, the adhesion layer may comprise a layer of an adhesive material covered by a thin compliant material.

The thin compliant material may then be in contact with the first and/or second atomically thin material.

According to some embodiments, the atomically thin layer may comprise one of graphene, hexagonal boron nitride or a transition metal di-chalcogenide.

Graphene may be a single-layer or monolayer, or a multilayer. Transition metal Di-chalcogenide (TMDC) may be of the type $MX_2$, with M representing a transition metal atom and $X_2$ two chalcogen atoms sandwiching the metal atom, such as molybdenum disulfide ($MoS_2$), tungsten diselenide ($WSe_2$), hafnium disulphide ($HfS_2$), tungsten disulfide ($WS_2$), molybdenum diselenide ($MoSe_2$), molybdenum ditelluride ($MoTe_2$). The atomically thin layer may also comprise other 2D materials.

The atomically thin layer may be formed on the donor substrate using various known methods. For example, the atomically thin layer may be formed using chemical vapor deposition (CVD), atomic layer deposition (ALD), molecular layer deposition (MLD), thermally assisted conversion (TAC), exfoliation, solvent exfoliation or sonication.

The adhesion layer may have a thickness in the range from 5 nm to 100 µm.

For example, the adhesion layer may be in a range of 200 nm-50 µm. Specifically, the adhesion layer may be in a range of 500 nm-20 µm.

The donor substrate may for example be chosen from: copper, cobalt, nickel, platinum, Iridium, ruthenium, Tin foil, Silicon carbide, or hydrogen-terminated germanium e.g. on silicon.

The target substrate may for example be chosen from Silicon, Silicon Oxide, Silicon germanium, Germanium, Silicon nitride, III-V materials such as gallium arsenide (GaAs), indium phosphide (InP), indium gallium arsenide (InGaAs), and indium gallium phosphide (InGaP), Chalcogenide glass, Indium(III)-fluoride, Diamond, Sapphire, Lithium niobate and other nonlinear materials, Piezoelectric materials or Polymers.

The material of the adhesion layer may for example be chosen from:

Benzocyclobutene (BCB), poly(p-xylylene) polymers, Parylene, Parylene C, Parylene N;

a polymer, which may be chosen from the following materials: polymer adhesives, thermoplastic polymers, thermoset polymers, elastomers, hybrid polymers, specific polymer adhesives such as, e.g., Benzocyclobutene (BCB), nanoimprint resist, polyimide, epoxy, SU8, polydimethylsiloxane (PDMS), and polymethyl methacrylate PMMA;

monolayers, such as, but not limited to, silanes, hydroxyl molecules, Silicon dioxide, metal oxides;

ductile metals such as gold, copper, aluminum or other metal alloys; or dielectric materials such as silicon dioxide ($SiO_2$), silicon nitride (SiN), Oxi-nitrides, metal oxides, or similar materials.

Methods according to the various embodiments of the present disclosure may provide a transfer process of atomically thin layers (or 2D materials), such as graphene, which allows the use of standard semiconductor tools. The methods according to the embodiments of the present disclosure may further provide improved repeatability, yield and scalability. The methods according the embodiments of the present disclosure may further avoid, or at least reduce, contamination by supporting layers. Further, electrical contacts with low contact resistance may be included.

Exemplary embodiments of the present disclosure are provided below. According to an exemplary embodiment of the present disclosure, a method of fabrication of a device with a two-dimensional (2D)/low-dimensional material is provided. The method may comprise providing a target substrate and providing a donor substrate on which an atomically thin layer or a stack of atomically thin layers is arranged, forming a donor substrate assembly.

The method may further comprise providing an adhesion layer on the target substrate and/or on the donor substrate assembly, on the same side as the atomically thin layer or stack of atomically thin layers.

The method may further comprise attaching the donor substrate assembly to the target substrate with the atomically thin layer or stack of atomically thin layers arranged between the donor substrate and the target substrate, forming a bonding assembly.

The method may further comprise removing the donor substrate from the bonding assembly after attachment of the donor substrate assembly to the target substrate.

The atomically thin layers or the stack of atomically thin layers may form a transferred layer assembly which may remain on the target substrate.

The transferred layer assembly may be in contact with the adhesion layer and/or the target substrate and/or structures on the target substrate surface. Parts of the transferred layer assembly may be suspended over a void or surface topography in/on the target substrate and/or the adhesion layer.

According to another exemplary embodiment, the method may further comprise integrating electrical contacts to the 2D material.

According to another exemplary embodiment, the method may further comprise, after the step of providing an adhesion layer on the target substrate and/or on the donor substrate assembly, and before attaching the donor substrate assembly to the target substrate, performing additional processing steps, including photolithography and/or material deposition and/or thermal processing and/or surface functionalization and/or layer transfer processes and/or wet/dry etching processes on the target substrate and/or the donor substrate assembly.

According to a further exemplary embodiment, the method may further comprise, after the step of removing the donor substrate, performing additional processing steps, including photolithography and/or material deposition and/or thermal processing and/or surface functionalization and/or layer transfer processes and/or wet/dry etching processes on the target substrate.

According to another exemplary embodiment, the method may further comprise creating a heterostructure of one or multiple transferred materials by a repetition of the steps of attaching the donor substrate assembly to the target substrate and/or removing the donor substrate from the bonding assembly and/or performing additional processing steps. Thus, a heterostructure is formed.

For repetition of these steps, either the existing adhesion layer from the previous step may be used, or a newly introduced adhesion layer may be used as described above. This means that the second/third etc. 2D material layer may bond partially on the adhesive layer and/or partially on the previous 2D material layer and/or partially on the surface structures that are not covered by the adhesive material.

According to a further exemplary embodiment, the 2D material may be in contact with an adhesive material, such as any of the adhesive materials mentioned above.

The transfer method disclosed herein is generic and applicable to a broad spectrum of 2D materials on various types of growth substrates.

It is noted that other embodiments using all possible combinations of features recited in the above described embodiments may be envisaged. Thus, the present disclosure also relates to all possible combinations of features mentioned herein.

BRIEF DESCRIPTION OF DRAWINGS

Exemplifying embodiments will now be described in more detail, with reference to the following appended drawings.

As illustrated in the figures, the sizes of the elements and regions may be exaggerated for illustrative purposes and, thus, are provided to illustrate the general structures of the embodiments. Like reference numerals refer to like elements throughout.

DETAILED DESCRIPTION

Exemplifying embodiments will now be described more fully hereinafter with reference to the accompanying drawings in which currently preferred embodiments are shown. The invention may, however, be embodied in many different forms and should not be construed as limited to the embodiments set forth herein; rather, these embodiments are provided for thoroughness and completeness, and fully convey the scope of the invention to the skilled person.

In the embodiments described below, a method for large-scale (large-area) graphene transfer may be performed entirely using established semiconductor tools and processes is presented. The methods may thus be suitable for high volume manufacturing of devices with suspended and supported graphene. The present approach requires no supporting layers on top of graphene, hence, residuals on the graphene surface may be avoided. The method presented here may go beyond the previous work, by wafer-scale fabrication and characterization and by the demonstration of suspended membranes of pristine graphene.

With reference to FIGS. 1-4 a method for transferring an atomically thin material (112), in accordance with some embodiments, will be described.

Figure 1:
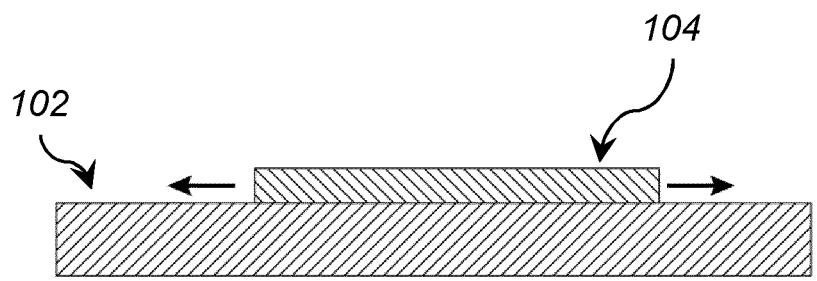
FIGS. 1-4 illustrate a method for transferring an atomically thin layer, in accordance with some embodiments.

FIG. 1 illustrates a target substrate 102 during formation of an adhesion layer 104 on the target substrate 102. The adhesion layer 104 comprises a 2.5 µm thick layer of benzocyclobutene (BCB), which is being spin coated on the target substrate. The target substrate 102 may for example be a 100 mm diameter silicon (Si) wafer.

It will be appreciated that the adhesion layer may comprise other materials, as described within the present disclosure. The adhesion layer may also be formed/deposited using other methods, such as spray coating. Furthermore, the adhesion layer may be formed at a donor substrate instead of the target substrate.

After spin coating of the BCB, the adhesion layer may be baked to pre-cure the adhesion layer, which may reduce its reflow in the following bonding step. Further, pre-curing the adhesion layer may increase its chemical stability by partially cross-linking. For example, when using BCB, baking may take place on a hot plate at 190° C. for 30 min.

Figure 2:
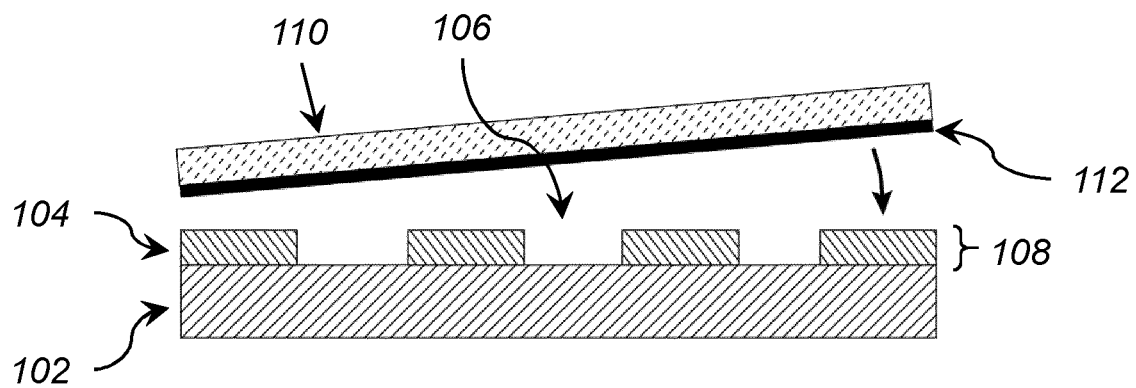

In FIG. 2, structures in the form of cavities 106 have been formed in the adhesion layer 104. The cavities 106 and the adhesion layer 104 together form an assembly. The cavities in the BCB layer were formed by a standard lithography and dry etching in O2/SF6 plasma.

In some embodiments, the cavities 106 may protrude into other layers in proximity with the adhesion layer, such as the substrate 102.

After removal of a resist mask used for the etching of the cavities (not depicted), the substrate 102 with the assembly 108 was brought in proximity to a donor substrate 110 on which an atomically thin layer 112 has been formed, such that the assembly 108 faces the atomically thin layer 112.

The atomically thin layer 112 is a 4-inch (100 mm) sheet of CVD graphene, formed on a copper foil donor substrate 110.

As previously described, the atomically thin layer may comprise one or more layers of other materials. Furthermore, the donor substrate 110 may also comprise other materials, such as cobalt, nickel, platinum, iridium, ruthenium, tin foil, silicon carbide, or hydrogen-terminated germanium e.g. on silicon.

Figure 3:
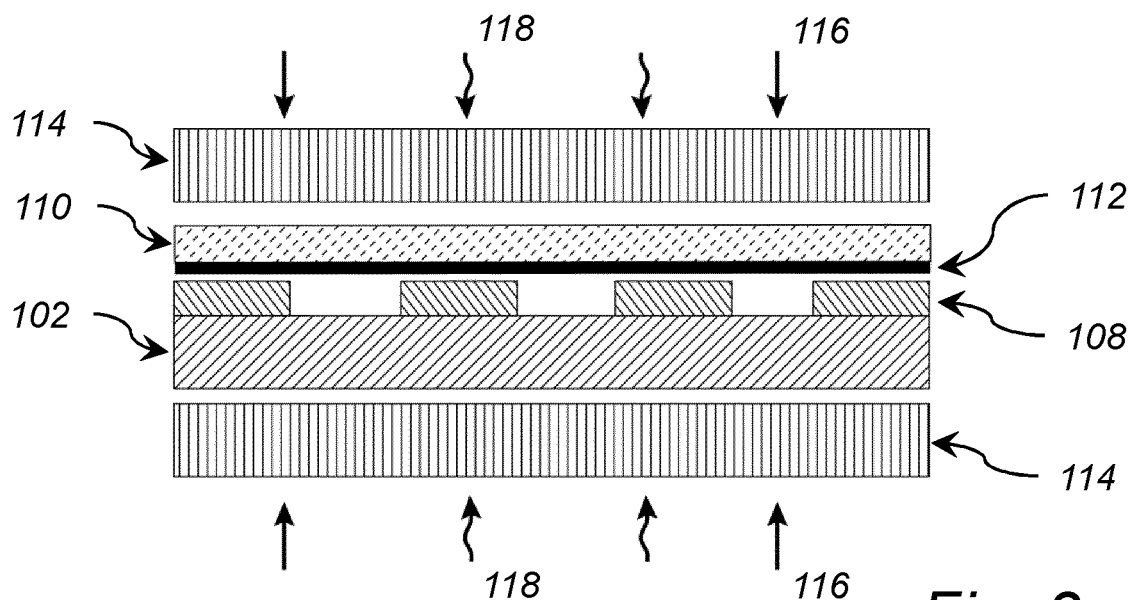

In FIG. 3, the target substrate 102 with the assembly 108 and the donor substrate 110 carrying the atomically thin layer 112 have been placed in a conventional adhesive wafer bonder illustrated by the bonder chucks 114. In FIG. 3, wafer bonding is taking place at elevated temperature 118 and applied force 116, i.e. the bonder chucks 114 press together the stack comprising the target substrate 102 and the donor substrate 110. Applied heat and force to the bonder chuck 114 temporarily decrease the viscosity of the adhesive (adhesion layer 104) which molds into the complimentary topography of the atomically thin layer 112 on the growth substrate (donor substrate 110) without exerting excessive pressure, hence, without damaging, wrinkling or straining the 2D material 112. For a thermosetting adhesive, chemical reactions partially cross-link its polymer chains which form a stable network with high chemical resistance.

The adhesive layer in the assembly 108 may thus mold to the target substrate 102 and the atomically thin layer 112, thereby bonding the stack together. For example, the stack may be bonded in a commercial wafer bonder (such as Suss-SB8) at 190° C. for 1 hour and at a bond force of 3 kN in vacuum.

Figure 4:
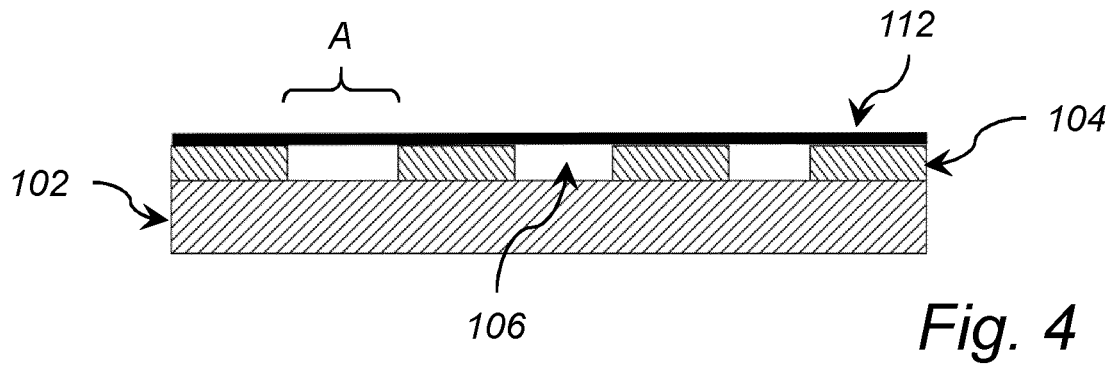

In FIG. 4, the donor substrate has been removed (e.g. by etching, delamination or intercalation of liquids at the interface of the 2D material), thereby uncovering the atomically thin layer 112 (graphene), which is now attached to the substrate 102. In regions A, the atomically thin layer 112 is now suspended over the cavities 106.

The copper foil donor substrate has been removed by etching using FeCl3 solution, although other removal methods and/or donor substrate materials may be used. After etching, the substrate may be cleaned. Cleaning may be performed using e.g. de-ionized water.

Conventional methods of transferring atomically thin layers, such as graphene, often rely on manual graphene transfer. Manual transfer may lead to issues like process variations, low yield and contamination by supporting layers. Further, usually such methods are only applicable to small substrates.

The method described above with reference to FIGS. 1-4 may allow for the use of conventional wafer bonding equipment. The described method may further allow manufacturing of large-area graphene and graphene membranes and remove the risk for contamination by a supporting layer, as no supporting layer is necessary. Furthermore, the above described method may be applicable to other two-dimensional materials, not only graphene.

Figure 5:
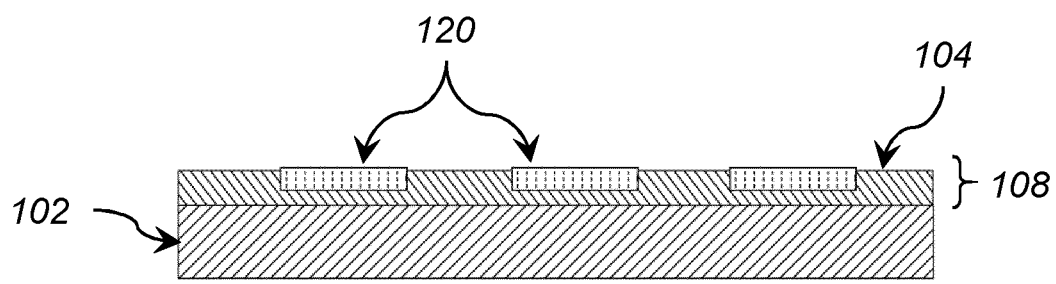
FIGS. 5-7 illustrate parts of a method for transferring an atomically thin layer, in accordance with some embodiments.
Figure 6:
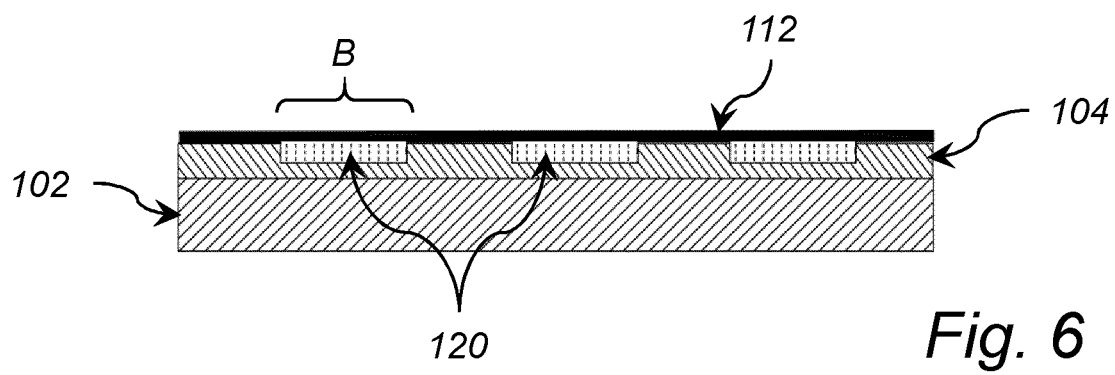
Figure 7:
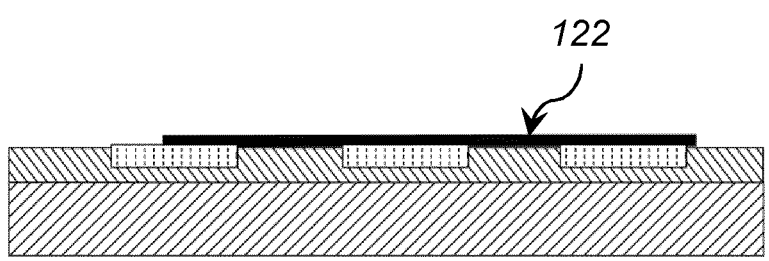

With reference to FIGS. 5-7, a method for transferring an atomically thin material, in accordance with some embodiments, will be described.

In FIG. 5, an assembly 108 has been formed on a target substrate 102. The assembly comprises a plurality of metal structures in the form of gold electrodes 120 in an adhesion layer 104. The gold electrodes 120 are partially inserted (or formed partially within) the adhesion layer 104, such that a portion of each gold electrode 120 is protruding above the adhesion layer 104 surface. A minimum step height between the electrodes 120 and the surrounding area is beneficial since it minimizes the risk of damaging the transferred layer, which may increase the yield of the fabrication process.

The target substrate 102 may be equivalent to the target substrate 102 described above with reference to any of the preceding figures. The adhesion layer 104 may be equivalent to the adhesion layer 104 described above with reference to any of the preceding figures. The adhesion layer 104 may further have been formed on the substrate 102 as described above with reference to FIGS. 1-4.

For example, the adhesion layer may be formed of benzocyclobutene (BCB). In the embodiment described above, the adhesion layer has been deposited on the target substrate. However, in other embodiments, the adhesion layer may be deposited at the donor substrate, (at least partially) directly on the atomically thin material and/or (at least partially) on some intermediate layer shielding the atomically thin material from the adhesion layer.

After deposition of the BCB as adhesion layer 104, the adhesion layer may have been soft baked at temperatures below 150 degree Celsius for up to 2 hours to remove solvents from the deposited BCB layer.

The BCB (adhesion layer 104) may further have been pre-cured at elevated temperature between 150-350 degrees Celsius for a time between 10 seconds and 100 hours to increase the chemical stability of the BCB.

Further, the BCB may have been structured using for example photolithography and etching of BCB (e.g. in O2/SF6 plasma or O2 plasma).

Different methods exist for forming the electrodes. For example, a resist mask may have been applied to the adhesion layer and patterned, followed by deposition of the metal (gold). The resist mask may subsequently have been lifted off, removing the excess metal and thereby forming the gold electrodes 120 on top of the adhesion layer 104. Furthermore, before the metal deposition, trenches may have been etched in the adhesion where the electrodes are going to be formed, such that the metal electrodes are formed (partially) within the adhesion layer.

In other embodiments, depending on the previous step of structuring of the BCB, the metal electrodes may be in contact with the material of the target substrate below the BCB layer or in contact with the graphene on the Cu foil.

For example, in some embodiments, the electrodes 120 may be integrated directly on the target substrate 102 by patterning a resist mask, metal deposition and lifting off the resist mask and therewith the excess metal covering the resist mask. The metal in the openings of the resist mask remains on the target substrate.

Material may further be removed from the target substrate 102 whereby the electrodes and the area in between the electrodes 120, which will later be the active area of the device, remains. Ideally, the electrodes and said area are on the same height.

The adhesion layer 104 may be deposited on the target substrate 102 and/or on an atomically thin layer 112 (graphene layer) formed at a donor substrate 110.

The adhesion layer 104 may be structured on the atomically thin layer 112 (graphene) on the donor substrate 110 (Cu foil) and/or on the target substrate 102 by photolithography and etching (e.g. in O2 plasma) to uncover the electrodes 120.

Further, the adhesion layer 104 may be thinned to adjust the step height between the adhesion layer 104 and the electrodes 120. Adjusting the step height allows to adjust the mechanical force applied on the atomically thin layer 112 in the region of the electrodes and the area which will later be the active area of the device. Too high force might damage the atomically thin layer 112. Too low force might result in insufficient attachment of the atomically thin layer 112 to the target substrate 102 and potential damage of the atomically thin layer 112 during removal of the donor substrate 110.

In FIG. 6, an atomically thin layer 112 has been transferred to the assembly 108. More specifically, the atomically thin layer 112 has been formed on a donor substrate. The donor substrate and the target substrate 102 with the assembly 108 have been arranged such that the atomically thin layer 112 is facing the gold electrodes, and adhesive wafer bonding of the target substrate and the atomically thin layer 112 (e.g. graphene) on the donor substrate (e.g. Cu foil) has been performed. For example, the bonding may have taken place at 150-350 degree Celsius for a time between 10 seconds and 100 hours and a bond force between 1 N and 100 kN.

After the bonding, the donor substrate has been removed e.g. by etching (or by exfoliation/peeling off the donor substrate while leaving the atomically thin layer 112 on the target substrate 102), thereby uncovering the atomically thin layer 112 lying on the target substrate 102.

Portions B of the atomically thin layer 112 are in contact with the gold contacts/electrodes 120, and other portions of the atomically thin layer 112 are bonded to the adhesion layer 104.

Depending on the topography of the target substrate before bonding, the metal deposition and the structuring of the adhesion layer, the transferred atomically thin layer might be in contact with the adhesion layer, and/or the metal electrodes and/or another material (i.e. SiO2) on the surface of the target substrate below or next to the adhesion layer. The atomically thin layer may further be suspended (free hanging) over a cavity in the adhesion layer or a cavity in another material in the surface of the target substrate.

The atomically thin layer 112 may be equivalent to the atomically thin layer 112 described above with reference to any of the preceding figures. Furthermore, the transfer method of the atomically thin layer 112 may have been performed using a method equivalent to the method described above with reference to FIGS. 2-4.

In FIG. 7, the transferred layer (i.e. the atomically thin layer 112) has been structured. For example, the structuring may have included photolithography and selective removal by dry etching (e.g. in O2 plasma), and selective removal of a protective resist mask (e.g. by dissolution in solvents).

The structured atomically thin layer 112 forms e.g. graphene devices which are contacted by the metal electrodes below.

In embodiments in which the electrodes 120 are formed directly on the target substrate 102, the active area of the device might not be in contact with the adhesion layer. The atomically thin layer 112 in the active area might be entirely supported on the target substrate 102, which may be an electrically insulating material such as silicon oxide, aluminum oxide or silicon nitride.

Further, the adhesion layer may be removed entirely by etching e.g. in oxygen plasma.

After this step, it is also possible to selectively deposit additional metal contacts/electrodes on top of the graphene and/or the lower metal contact to improve/reinforce the metal-graphene contacts or to establish additional top metal contacts to the graphene.

It will be appreciated that, similarly to the formation and treatment of the electrodes 120, dielectric structures may be incorporated in or on the adhesive layer or on the atomically thin material 112.

Figure 8:
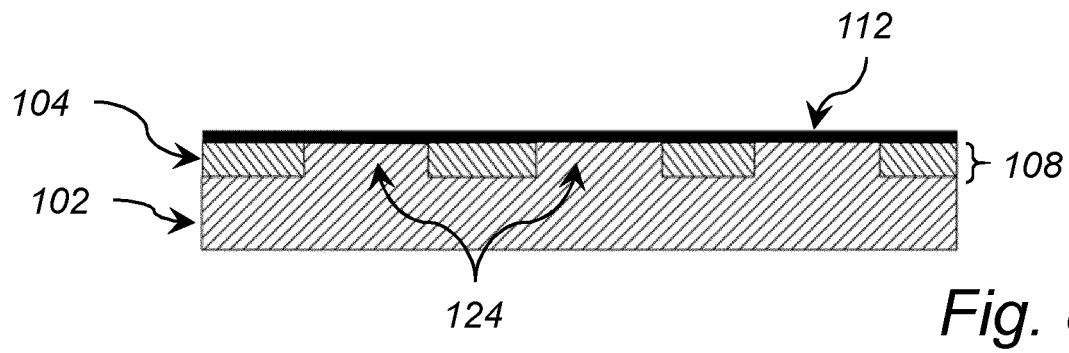
FIG. 8 illustrates a device formed using a method in accordance with some embodiments.

FIG. 8 shows a target substrate 102 on which an assembly 108 has been formed, and onto which an atomically thin layer 112 has been transferred. The device shown in FIG. 8 may be equivalent to those described with reference to FIG. 4 or FIG. 7, except that the structures in the assembly 108 comprise a plurality of protrusions 124 of the target substrate 102 through the adhesion layer 104. The adhesion layer 104 may have been formed using any of the methods described above with reference to preceding figures. The atomically thin layer may have been formed at a donor substrate and transferred using adhesive wafer bonding and subsequent removal of the donor substrate, as described above with reference to preceding figures.

With reference to FIGS. 9-13 formation of a 2D material heterostructure device will be described.

A novel and versatile dry transfer of 2D materials and their heterostructures based on adhesive wafer bonding, using widely available and commercial semiconductor equipment, are provided. For demonstration, van der Waals heterostructures are formed by repeated transfer of 2D materials to the same target substrate 102. The existing adhesive below the first 2D material is reused by tuning the degree of cross-linking in the adhesive layer.

Additionally, the chemical resistance of partially cross-linked thermosetting adhesives allows the integration of bottom contacts before transfer of the 2D materials.

Figure 9:
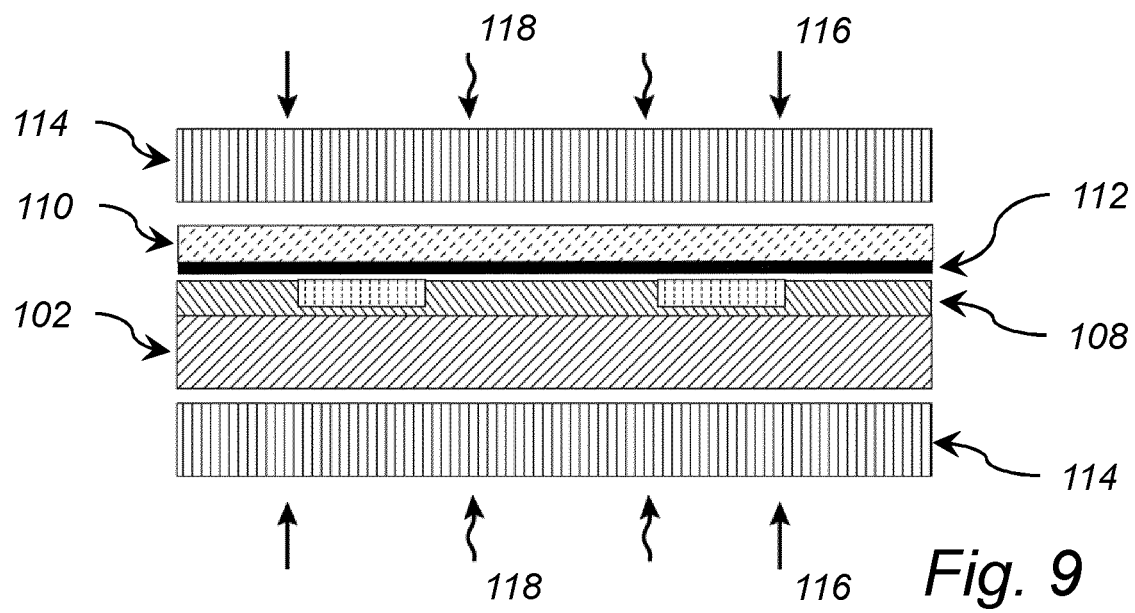
FIGS. 9-13 illustrate parts of a method for transferring an atomically thin layer, in accordance with some embodiments.

FIG. 9 shows a first wafer bonding step of forming such a heterostructure device.

On the target substrate 102 an assembly 108 comprising an adhesive layer 104 and two electrodes 120 (as described with reference to FIG. 5) has been formed. In the present embodiment, the electrodes' 120 top surfaces are levelled with the top surface of the adhesion layer 104.

On a (first) donor substrate 110 a (first) atomically thin layer 112 has been formed. The donor substrate 110 may be a copper foil. The atomically thin layer 112 may be a multilayer of hexagonal boron nitride (hBN). The electrodes 120 may be gold electrodes. The adhesion layer 104 may comprise BCB.

The target substrate 102 with the assembly 108 and the donor substrate 110 with the atomically thin layer 112 have been arranged in the bonder chucks 114 of a wafer bonder, such that the atomically thin layer 112 faces the assembly 108. During the bonding, the combined structure (comprising target substrate 102, the donor substrate 110 and the layers and structures formed thereon) may be heated 118. The higher temperature may increase the viscosity of the adhesion layer 104, making it mold to the second atomically thin layer 112. Further, force/pressure 116 may be applied to the bonder chucks 114, pressing the target substrate 102 and the second donor substrate 128 together. For example, the wafer bonding may take place e.g. at 150-350 degree Celsius for a time between 10 seconds and 100 hours and a bond force between 1 N and 100 kN, such as at 190° C., for 20 min and at 250 N bond force.

Figure 10:
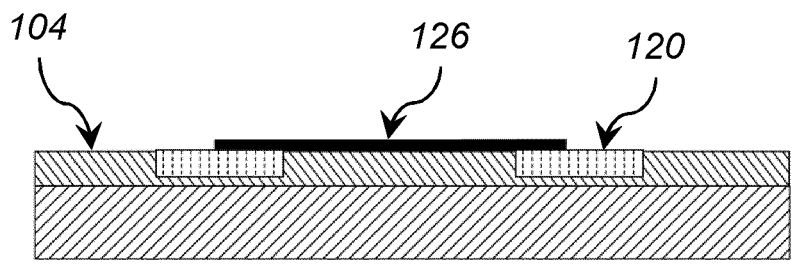

In FIG. 10, the combined structure has been taken out of the wafer bonder. Further, the donor substrate 110 has been removed, e.g. by etching using $FeCl_3$, to uncover the atomically thin layer 112 lying on top of the adhesion layer 104 (BCB) and the electrodes 120.

The atomically thin layer 112 has been structured to form a patch 126 (or a structure comprising a second atomically thin layer), for example using ablation by a femtosecond-laser. Excess h-BN has been removed from the BCB outside the active area. The hBN patch 126 is at one end in contact with one of the electrodes 120, and at the other in contact with the other electrode 120.

Figure 11:
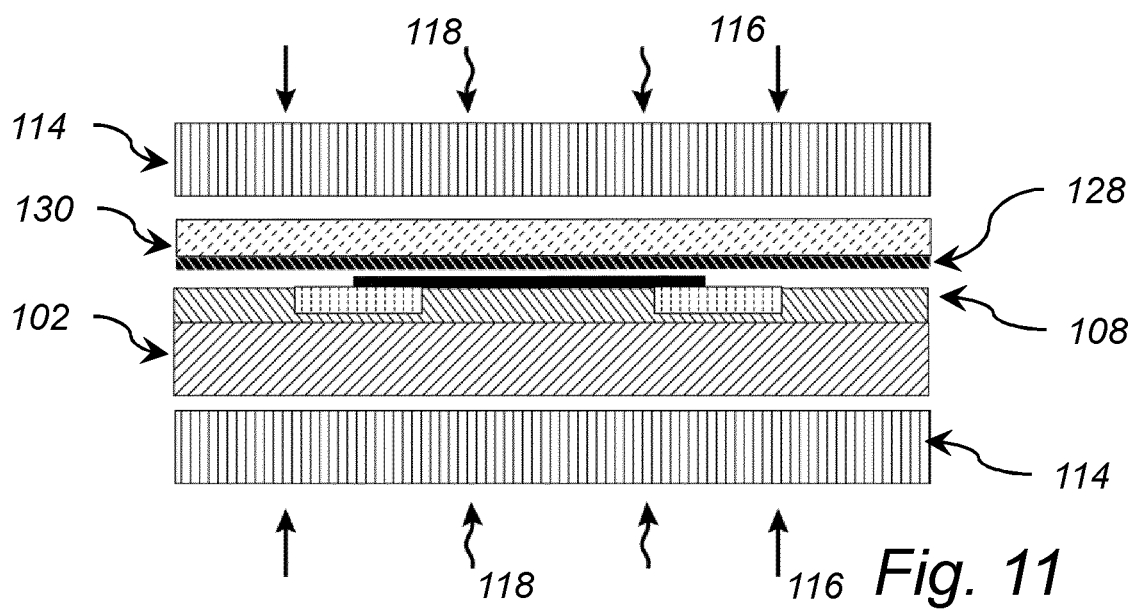

In FIG. 11, the target substrate with the assembly 108 and the atomically thin layer patch 126 has been arranged in a wafer bonder together with a (second) donor substrate 130 on which a (second) atomically thin layer 128 has been formed. The (second) donor substrate 130 may be a copper foil, and the (second) atomically thin layer 128 may be of single-layer graphene. The substrates 102 130 have been arranged in the bonder chucks 114 such that the patch 126 faces the (second) atomically thin layer 128.

In FIG. 11, wafer bonding is taking place at elevated temperature 118 and/or applied pressure/force 116. For example, at 150-350 degree Celsius for a time between 10 seconds and 100 hours and a bond force between 1 N and 100 kN, such as at 190° C. for 20 min and at 3 kN bond force.

Tuning the degree of cross-linking in the adhesive layer by appropriate choice of bond temperature and time, allows repeated transfer of 2D materials to the same target substrate—reusing the existing adhesive below the first 2D material. Consequently, van der Waals heterostructures can be formed by repetition of steps: material placement, wafer bonding and substrate removal.

It will be appreciated that, neither the interface between the materials nor the second 2D material are exposed to any carrier polymer nor adhesive which might degrade materials properties by contamination. Additionally, the chemical resistance of partially cross-linked thermosetting adhesives allows conventional wafer processing before and after transfer of the 2D material.

Figure 12:
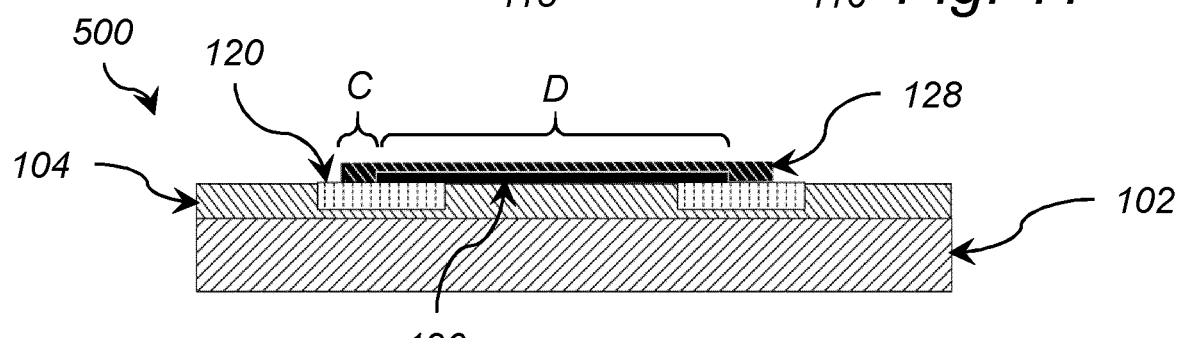
Figure 13:
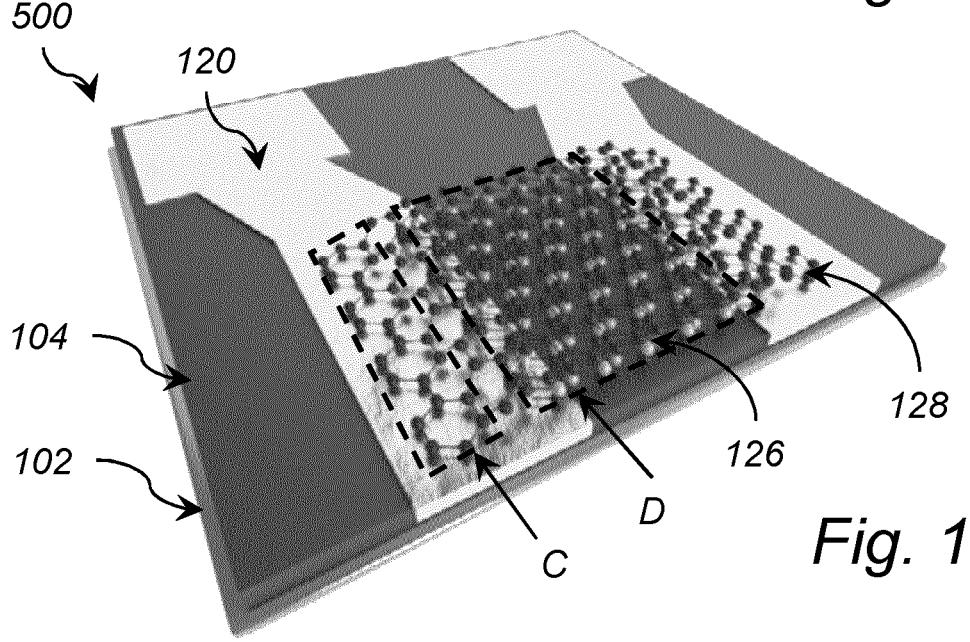

In FIG. 12, the substrates 102 130 have been taken out of the wafer bonder. FIG. 12 shows a cross-section of a device 500 formed on the target substrate 102. FIG. 13 shows a perspective view of the same device 500.

In FIGS. 12 and 13, the (second) donor substrate 130 has been removed (e.g. by etching). The (second) atomically thin layer 128 (graphene) has been structured (e.g. by etching, or by femtosecond-laser ablation), thereby defining the active areas of the device 500 which is electrically contacted by the electrodes and removing excess graphene from the BCB outside the active area.

In this device 500, the multilayer hBN 126 (structured first atomically thin layer) and the single layer graphene 128 (second atomically thin layer) form a heterostructure in a heterostructure region D. Further, the graphene layer 128 extends outside the heterostructure region D to contact the gold electrodes 120 in contact regions C.

After these steps, further layers may be applied using similar methods (deposition on a growth substrate and transfer by adhesive wafer bonding). For example, an additional layer of hBN may be applied, such that the heterostructure consists of a layer of graphene, sandwiched in between two layers of h-BN.

Furthermore, a second layer of metal may be deposited and structured on top of the insulating layer of h-BN, forming a gate electrode which allows gating of the graphene electrostatically to alter the electrical properties of the graphene sheet.

Characterization of all transferred layers and heterostructures indicates that the present transfer method preserves the mechanical quality of 2D materials as present as on the growth substrate without introducing wrinkles or excessive strain. By avoiding polymeric carrier layers, the present method eliminates a source of contamination on the surface of the 2D material and allows contamination-free stacking of 2D materials to heterostructures. Additionally, the present method avoids manual handling of released layers and relies only on established process steps which make it compatible with large-scale manufacturing in industrial facilities.

Figure 14:
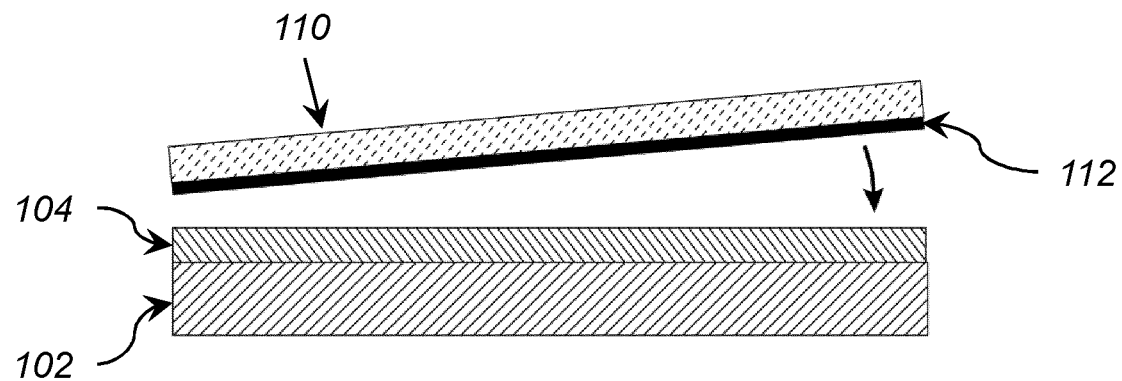
FIGS. 14-15 illustrate steps of a method for transferring an atomically thin layer, in accordance with some embodiments.
Figure 15:
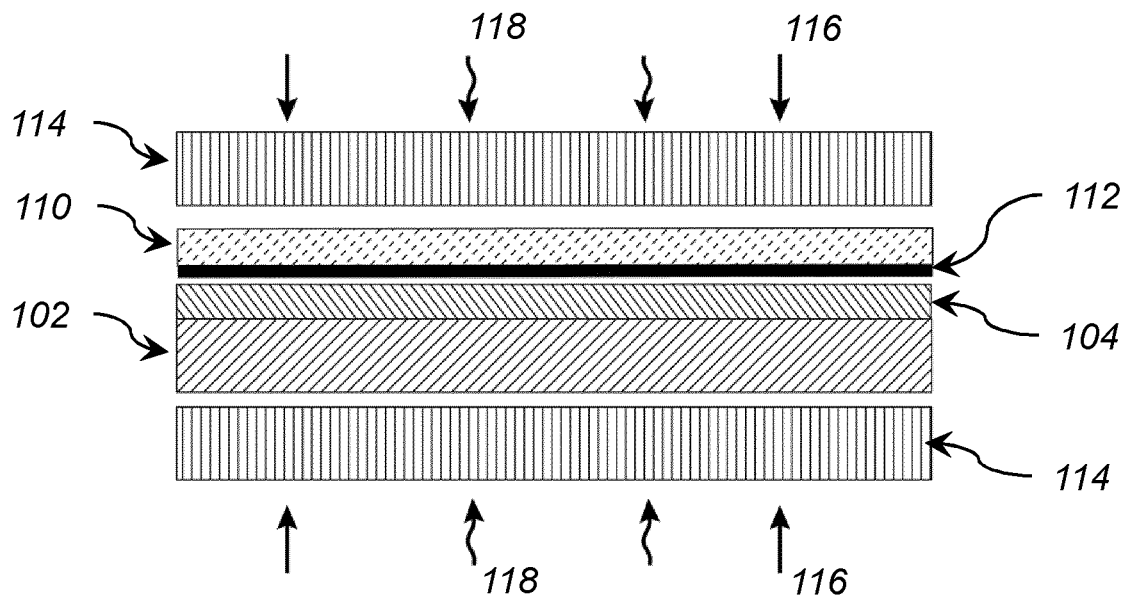

With reference to FIGS. 14 and 15, a method for transferring an atomically thin layer 112 will be described. Apart from there being no structures in the adhesive layer, the presently described method may be equivalent to any of the methods described above, with reference to any of the preceding figures.

FIG. 14 shows a step during transfer of an atomically thin layer 112 equivalent to that described with reference to FIG. 2. Prior to this step, an adhesion layer 104 has been formed (or disposed) on the target substrate. Contrary to the situation in FIG. 2, no cavities (or other structures) have been formed in or on the adhesion layer 104. An atomically thin material 112 has been formed on a donor substrate 110. FIG. 14 illustrates the donor substrate 110 being brought together with the target substrate 102, such that the atomically thin layer 112 faces the adhesion layer 104.

FIG. 15 illustrates the donor substrate 110 and the target substrate 102 being arranged in the bonder chucks 114 of a wafer bonder. During the adhesive wafer bonding, pressure/force 116 may be applied to the substrates 102, 110, such that the substrates 102, 110 are pressed together. Further, heat 118 may be applied, which may result in the adhesion layer becoming (at least substantially) incompressible (if not being in an incompressible state already before applying heat), such that it molds to the atomically thin layer 112.

The adhesive wafer bonding step presented in FIG. 15 may be equivalent to any adhesive wafer bonding step described above with reference to FIGS. 3 and 9.

After bonding, the donor substrate may be removed, for example by etching, which reveals the transferred atomically thin layer 112.

Further Exemplary Embodiments and Experimental Results

Further exemplary embodiments and some related experimental results will be described below.

Transfer of Graphene Using BCB Adhesion Layer

Measurements were made on a device formed according to the method described above with reference to FIGS. 1-4.

Raman spectroscopy was performed in 13 measurement areas (20 μm×20 μm), each with 3600 independently acquired spectra. In total, 99.36% of 46800 measurements reveal the characteristic 2D- and G-peaks around 2700 cm-1 and 1580 cm-1 respectively, thus confirming the presence of graphene.

SEM images confirm that the surface topography of the BCB resembles the surface topography of the copper growth substrate, as measured by an optical profilometer. This indicates that the adhesive conforms to the shape of the donor substrate and that the transferred graphene is not (or at least very little) deformed/stretched during the transfer.

The electrical sheet resistance of the transferred graphene layer was measured at 33 positions on the wafer with a four-point probe and averaged to 1357 Ω/square (1σ=283 Ω/square), which further indicates a successful transfer of the graphene.

Transfer of Graphene and Formation of Graphene/hBN Heterostructures

The present transfer method is generic and applicable to a broad spectrum of 2D materials on various types of growth substrates. Here, large-area integration of a graphene/hexagonal boron nitride (hBN) heterostructure is demonstrated (see Methods below for details of the process and materials). In short, consecutive transfers of multilayer hBN (2.5 cm by 2.5 cm) and monolayer graphene (4-inch diameter), both synthesized by chemical vapor deposition (CVD) on copper foil, formed a graphene/hBN heterostructure on a 100 mm Si wafer, surrounded by monolayer graphene on BCB. We note that in the heterostructure neither graphene nor the top surface of hBN was in contact with potentially contaminating polymer or adhesive at any time. Evaporation of Ti/Au electrodes through a shadow mask and cutting of the transferred layers by fs-laser ablation defined van-der-Pauw (vdP) devices for material characterization.

Four-point probe measurements of the vdP devices yielded the graphene sheet resistance (Rsh), carrier density (n) and mobility of majority charge carrier (μ), of the transferred graphene layer, both for graphene resting on BCB and on hBN (see Methods). In both cases, it was found that Rsh is similar (626.7±92.0 Ω/sq. and 603.3±92.7 Ω/sq. respectively) whereas the n and μ showed differences when laying on BCB and hBN, respectively. The carrier density of graphene on BCB was lower than on hBN ($3.7 \cdot 10^{12} \pm 0.73 \cdot 10^{12}$ cm$^{-2}$ and $4.9 \cdot 10^{12} \pm 0.20 \cdot 10^{12}$ cm$^{-2}$) while the mobility was higher for graphene on BCB than for the graphene/hBN heterostructure (2846±129 cm$^2$V$^{-1}$s$^{-1}$ and 2034±177 cm$^2$V$^{-1}$s$^{-1}$).

Repeated Transfer to Form Double-Layer Graphene

Stacking of two or multiple layers of graphene is of interest for suspended devices to increase yield and stability but also for fundamental material research which discovered astonishing properties such as unconventional superconductivity and correlated insulation. To demonstrate that the present transfer method is applicable for these potential applications, double-layer (2-layer) graphene were formed by repeated transfer of two graphene monolayer (1-layer) from their copper growth substrates to a 100 mm silicon wafer (see Methods for process details). After transfer, graphene covered the right side of the wafer whereby a 2-layer region in the center was surrounded by 1-layer graphene, both resting on BCB. For reference, the graphene on the left side of the wafer was removed from the growth substrate prior transfers.

Transfer of MoS2

Our proposed transfer method is generic and applicable to a broad spectrum of 2D materials on various types of growth substrates. Here, the transfer of monolayer MoS2 from centimeter sized SiO2/Si chips to 100 silicon wafers is demonstrated (see Methods for parameters of film growth and transfer). In short, bonding at 190° C. and 400 N bond force for 20 min attached the MoS2/SiO2/Si stack to the target wafer. Submersion of the bonded stack in KOH solution (2M) detached the growth substrate by intercalation at the MoS2/SiO2 interface within tens of seconds whereupon the MoS2 remained transferred to the target substrate. To evaluate the quality of the transferred MoS2 monolayers, Raman and Photoluminescence (PL) spectroscopy was conducted under ambient conditions. Taken together, Raman and PL measurements confirm the conservation of layer properties as present as on the growth substrate without causing deterioration, hence, the present transfer method is suitable for large-area MoS2 films.

In conclusion, a generic method to dry-transfer 2D materials and to from their heterostructures was developed, which preserves the material properties as present as on the growth substrate. The ability of the adhesive layer to mold repeatedly into the topography of the growth substrate allows stacking of layers to heterostructures without intermediate contamination by residuals of polymeric carrier layers. In this process, the surface topography of the growth substrate is replicated on the target substrate which prevents wrinkles and additional strain in the transferred 2D material. Experimentally, Raman and photoluminescence spectroscopy indicate little strain in the transferred graphene and MoS2. THz near-field inspection confirms the uniform coverage of graphene in large areas while the evaluation of vdP devise yields a high charge carrier mobility of 2846±129 cm$^2$V$^{-1}$s$^{-1}$.

Method: Transfer of Graphene and Formation of 2-layer Graphene

A 2.5 μm thick layer of bisbenzocyclobutene (BCB) (CYCLOTENE 3022-46, Dow Inc.) was spin-coated at 5000 rpm on the 100 mm target wafer. Soft-bake on a hot-plate at 100° C. for 4 min removed solvents. The target wafer was brought in proximity to a quarter of a 4-inch sheet of monolayer CVD graphene on copper foil (Graphenea Inc.) with the graphene facing the BCB layer. This stack was bonded in a commercial wafer bonder (Suss-SB8) at 190° C. for 20 min at a bond force of 600 N in nitrogen atmosphere. Etching the copper foil in FeCl3 solution and rinsing in deionized water uncovered the graphene, transferred to the target substrate. To form 2-layer graphene a 4-inch sheet of CVD graphene on copper foil was placed on top of the substrate, bonded (190° C., 20 min, bond force: 3 kN, vacuum atmosphere) and uncovered by etching. Note, the bond force was adapted to account for the increased size of the growth substrate. To form reference areas for THz spectroscopy, the 4-inch copper foil was cut into two pieces and graphene was partially removed from one by etching in O2 plasma prior transfer. During transfer, both parts were placed side by side, covering the entire target substrate.

Method: Formation of Graphene/hBN Heterostructures

A 100 mm wafer was spin-coated a 2.5 μm thick layer of BCB (CYCLOTENE 3022-46, Dow Inc.; spinning speed: 5000 rpm, soft-bake: 100° C. for 4 min). A 2.5 cm×2.5 cm sheet of multilayer hBN synthesized by CVD on copper foil (2D Semiconductors Inc.) was placed on top of the target substrate (hBN facing the BCB layer) and bonded at 190° C. for 20 min at a bond force of 250 N in nitrogen atmosphere. Submersion in FeCl3 and subsequent rinsing in deionized water uncovered the transferred hBN on to target substrate. Transferring a 4-inch sheet of monolayer CVD graphene (see above) on top of the hBN layer formed a graphene/hBN heterostructure on the target wafer.

Method: Fabrication and Evaluation of Van-Der-Pauw Devices

After formation of the graphene/hBN heterostructure on an oxidized 100 mm silicon wafer (100 nm SiO2) (see above) thermal evaporation of 20 nm Ti and 200 nm Au through a shadow mask formed electrodes (300 μm×300 μm) on top of the transferred graphene layer. Ablation by a pulsed fs-laser system electrically insulated individual van-der-Pauw devices with an edge length of about 3 mm. For device characterization, the wafer was placed inside a probe station (Cascade Microtech Inc.) resting on an electromagnet (Wuxue Wen Fang Electric Co. Ltd, model WF-P25/20). Four-point probe measurements of the voltage across the device edge (device current: 100 µA) and the Hall voltage (device current: 1 mA, magnetic flux: 28.8 mT) by a Keithley SCS4200 yielded the sheet resistance, carrier density and mobility of the transferred graphene.

Method: Transfer of MoS2

Spin coating of a 100 mm silicon wafer with BCB (CYCLOTENE 3022-46, Dow Inc.) at 5000 rpm and soft-baking at 100° C. for 4 min resulted in a 2.5 µm thick layer of adhesive on the target wafer. A monolayer of MoS2, grown on oxidized silicon chips (10 mm×7 mm), was placed on top of the BCB layer (MoS2 facing the target wafer) and surrounded by silicon dummy chips of the same height to ensure a uniform force distribution during the bonding process. Bonding at 190° C. for 20 min and a bond force of 400 N partially cross-linked the BCB and attached the MoS2 layer on its growth substrate to the target wafer. Etching in O2/SF6 plasma cleaned the edges of the growth substrate from potential BCB residuals and submersion of the bonded stack in KOH solution (2M) detached the growth substrate within tens of seconds from the MoS2 which remained on the target substrate.

The person skilled in the art realizes that the present invention by no means is limited to the preferred embodiments described above. On the contrary, many modifications and variations are possible within the scope of the appended claims.

Although features and elements are described above in particular combinations, each feature or element can be used alone without the other features and elements or in various combinations with or without other features and elements.

Additionally, variations to the disclosed embodiments can be understood and effected by the skilled person in practicing the claimed invention, from a study of the drawings, the disclosure, and the appended claims. In the claims, the word "comprising" does not exclude other elements, and the indefinite article "a" or "an" does not exclude a plurality. The mere fact that certain features are recited in mutually different dependent claims does not indicate that a combination of these features cannot be used to advantage.

The invention claimed is:

1. A method for transferring an atomically thin layer, the method comprising: providing a target substrate; providing a donor substrate on which a first atomically thin layer has been formed; disposing an adhesion layer at the donor substrate or at the target substrate; forming an assembly comprising said adhesion layer and at least one structure, said assembly being formed at the donor substrate and/or at the target substrate; bringing together the target substrate and the donor substrate such that at least a portion of said first atomically thin layer is arranged against said at least one structure, and said adhesion layer is arranged against said target substrate; bonding together the donor substrate, the assembly and the target substrate; and removing said donor substrate.

2. The method of claim 1, wherein said at least one structure comprises at least one cavity in said adhesion layer, and wherein after removal of said donor substrate, a portion of said first atomically thin material is suspended over said at least one cavity.

3. The method of claim 1, wherein said at least one structure comprises at least one metal structure.

4. The method of claim 1, wherein said at least one structure comprises at least one dielectric structure.

5. The method of claim 1, wherein said at least one structure comprises at least one protrusion of said target substrate through said adhesion layer.

6. The method of claim 1, wherein said at least one structure comprises a second atomically thin layer.

7. The method of claim 6, wherein said structure comprising said second atomically thin layer further comprises a further layer covering at least a portion of said second atomically thin layer, and wherein said further layer is in contact with said adhesion layer.

8. The method of claim 1, wherein said adhesion layer comprises a layer of an adhesive material covered by a thin compliant material.

9. The method of claim 1, wherein said atomically thin layer comprises one of graphene, hexagonal boron nitride or a transition metal di-chalcogenide.

10. The method of claim 1, wherein, during said bringing the target substrate and the donor substrate together, said adhesion layer is incompressible, or at least substantially incompressible, with a viscosity below 10000 cPs.

11. The method of claim 1, wherein bonding together the donor substrate, the assembly and the target substrate comprises applying heat.

12. The method of 1, wherein bonding together the donor substrate, the assembly and the target substrate comprises applying pressure.

13. The method of claim 1, wherein removing said donor substrate comprises etching said donor substrate or detaching by intercalation of components at the interface between said donor substrate and said atomically thin layer.

14. The method of claim 1, further comprising:
providing a second donor substrate on which a second atomically thin layer has been formed;
bringing the target substrate and the second donor substrate together such that at least a portion of said second atomically thin layer is in contact with said first atomically thin layer;
bonding said second atomically thin layer to said first atomically thin layer; and
removing said second donor substrate.

* * * * *